US007477085B2

(12) United States Patent
Stevenson

(10) Patent No.: US 7,477,085 B2
(45) Date of Patent: Jan. 13, 2009

(54) DIGITAL ATTENUATOR CIRCUITS AND METHODS FOR USE THEREOF

(75) Inventor: Jan-Michael Stevenson, Frisco, TX (US)

(73) Assignee: Microtune (Texas), L.P., Plano, TX (US)

( * ) Notice: Subject to any disclaimer, the term of this patent is extended or adjusted under 35 U.S.C. 154(b) by 32 days.

(21) Appl. No.: 11/442,643

(22) Filed: May 26, 2006

(65) Prior Publication Data
US 2007/0273424 A1    Nov. 29, 2007

(51) Int. Cl.
*H03L 5/00* (2006.01)

(52) U.S. Cl. .................... 327/308; 333/81 R
(58) Field of Classification Search .............. 327/308; 333/81 R
See application file for complete search history.

(56) References Cited

U.S. PATENT DOCUMENTS

| 4,050,055 | A | * | 9/1977 | DiLeo ..................... 367/87 |
| 4,803,440 | A | * | 2/1989 | Hotta et al. ................. 330/145 |
| 4,837,530 | A | * | 6/1989 | Kondoh .................... 333/81 A |
| 5,710,991 | A | * | 1/1998 | Lee ........................... 455/126 |
| 5,912,599 | A | * | 6/1999 | Beall ......................... 333/81 R |
| 6,300,814 | B1 | * | 10/2001 | Takahashi ................... 327/308 |
| 6,337,974 | B1 | * | 1/2002 | Inamori et al. .............. 455/126 |
| 7,221,207 | B2 | * | 5/2007 | Fukumoto et al. ........... 327/365 |
| 7,253,700 | B1 | * | 8/2007 | Chiu ......................... 333/81 R |
| 7,265,604 | B2 | * | 9/2007 | Yasuda et al. ............... 327/430 |
| 2005/0118971 | A1 | | 6/2005 | Arai et al. |

FOREIGN PATENT DOCUMENTS

| WO | WO-01/13513 | 2/2001 |
| WO | WO-01/93437 | 12/2001 |

OTHER PUBLICATIONS

Office Action and Partial International Search issued for PCT/US2007/069423 application dated Feb. 4, 2008, 8 pgs.

* cited by examiner

*Primary Examiner*—Kenneth B. Wells
(74) *Attorney, Agent, or Firm*—Fulbright & Jaworski L.L.P.

(57) ABSTRACT

An attenuator system includes a first adjustable impedance component on a first current path between a input component and a output component, and a second adjustable impedance component between the first current path and ground, wherein each of the first and second adjustable impedance components include a plurality of selectable, discrete legs, each leg having an impedance.

34 Claims, 3 Drawing Sheets

DIGITAL ATTENUATOR CIRCUITS AND METHODS FOR USE THEREOF

CROSS-REFERENCE TO RELATED APPLICATIONS

The present application is related to co-pending and commonly-assigned U.S. patent application Ser. No. 11/441,816, filed concurrently herewith on May 26, 2006, entitled, "AGC SYSTEM AND METHOD FOR BROADBAND TUNERS," the disclosure of which is hereby incorporated herein by reference.

TECHNICAL FIELD

Various embodiments of the present invention relate, in general, to attenuation circuits, and more specifically, to digitally-controllable attenuation circuits.

BACKGROUND OF THE INVENTION

In prior art Radio Frequency (RF) tuners, Automatic Gain Control (AGC) is often performed at the beginning of the RF signal path before the signal is fed to distortion-causing circuitry, such as amplifiers. For instance, tuners typically maintain an output signal power level at or below a certain reference value. The reference value is usually based on an assumption that the signal power level at any point in the signal path is unlikely to drive a component "to the rails" if the output signal is at or below the reference value. Attenuation is performed on the signal input when it is determined that the output signal power level is above the reference value.

In one prior art application, analog AGC is performed inside the first amplifier itself. However, this approach is prone to distortion, since the AGC is performed inside the amplifier. Another approach is to use a pin-diode attenuator in the signal path before the distortion-causing circuitry. However, pin-diode attenuators typically cannot be built on a semiconductor chip, such that in tuner-on-chip applications, the attenuation is performed off-chip.

BRIEF SUMMARY OF THE INVENTION

Various embodiments of the present invention are directed to systems and methods for providing digitally-controllable attenuation. In one example, an attenuator circuit includes a voltage-divider arrangement with two adjustable impedance components, the second of which is shunted to ground. The attenuation is a function of the relative values of the adjustable impedance components.

In this example, each of the adjustable impedance components includes a plurality of selectable, discrete elements that each have some amount of impedance. In each adjustable impedance component, selecting one or more of the elements determines the impedance of the component. Each discrete element can be switched on or off using, e.g., a transistor that is controlled by digital control lines. Thus, digital signals from the control lines can provide a range of discrete impedance values for each impedance component. Accordingly, the attenuation of the circuit is controllable digitally.

An example method using the arrangement described above includes receiving an RF signal, and adjusting the impedances of the impedance components (and, therefore, the attenuation) based upon the signal level. The adjusting is performed, e.g., by switching one or more of the selectable elements in each of the impedance components using digital control lines. The values of each of the impedance components may be constrained by one or more requirements, including, e.g., input/output impedance values, linearity of operation, and relationships between changes in attenuation versus changes in noise and/or distortion.

An advantage of one or more embodiments is that the attenuator circuit can be implemented in a chip along with various other components of a tuner. In fact, one or more of such attenuator circuits can be placed along the RF signal path, including before the first amplifier. In such manner, attenuation can be performed on large input signals so that the actual signal level going into the first amplifier is at or below a "take over point," or other reference level.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
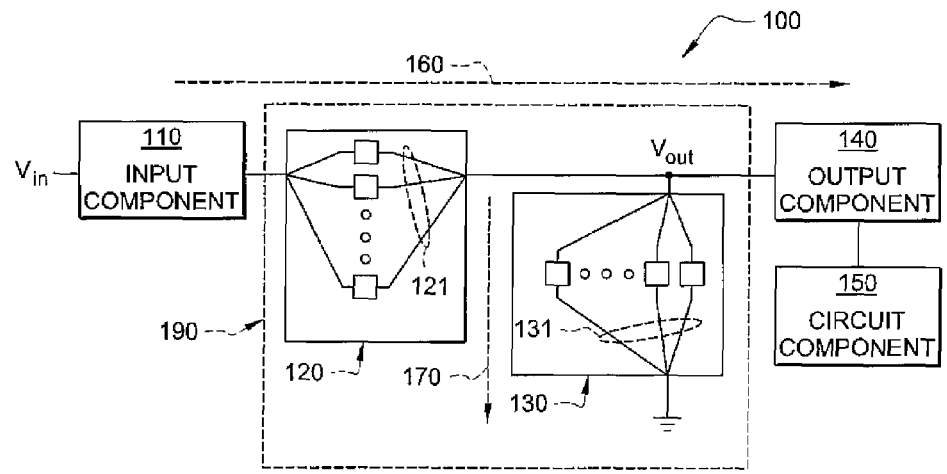
FIG. 1 is an illustration of an exemplary system adapted according to one embodiment of the invention.

FIG. 1 is an illustration of exemplary system 100 adapted according to one embodiment of the invention. System 100 includes input component 110 receiving an input signal that has a voltage $V_{in}$, first adjustable impedance component 120, and second adjustable impedance component 130, which is shunted to ground. Output voltage $V_{out}$ at output component 140 (e.g., wire, contact, or the like), is fed to the input of circuit component 150 (e.g., amplifier, mixer, filter, or the like). First adjustable impedance component 120 may be referred to herein as a "series" component because it is in series in first current path 160 between input component 110 and output component 140. Likewise, second adjustable impedance component 130 may be referred to herein as a "shunt" component because it is shunted. Second adjustable impedance component 130 creates second current path 170.

Each of first and second adjustable impedance components 120 and 130 includes a plurality of selectable, discrete legs 121 and 131, respectively, that each have some amount of impedance. Attenuation circuit 190 can be used for Automatic Gain Control (AGC) to provide $V_{out}$ at an approximately constant signal level (i.e., 3 dB deviation or less from a reference value) by controlling the impedances of components 120 and 130, as explained further below.

Figure 2:
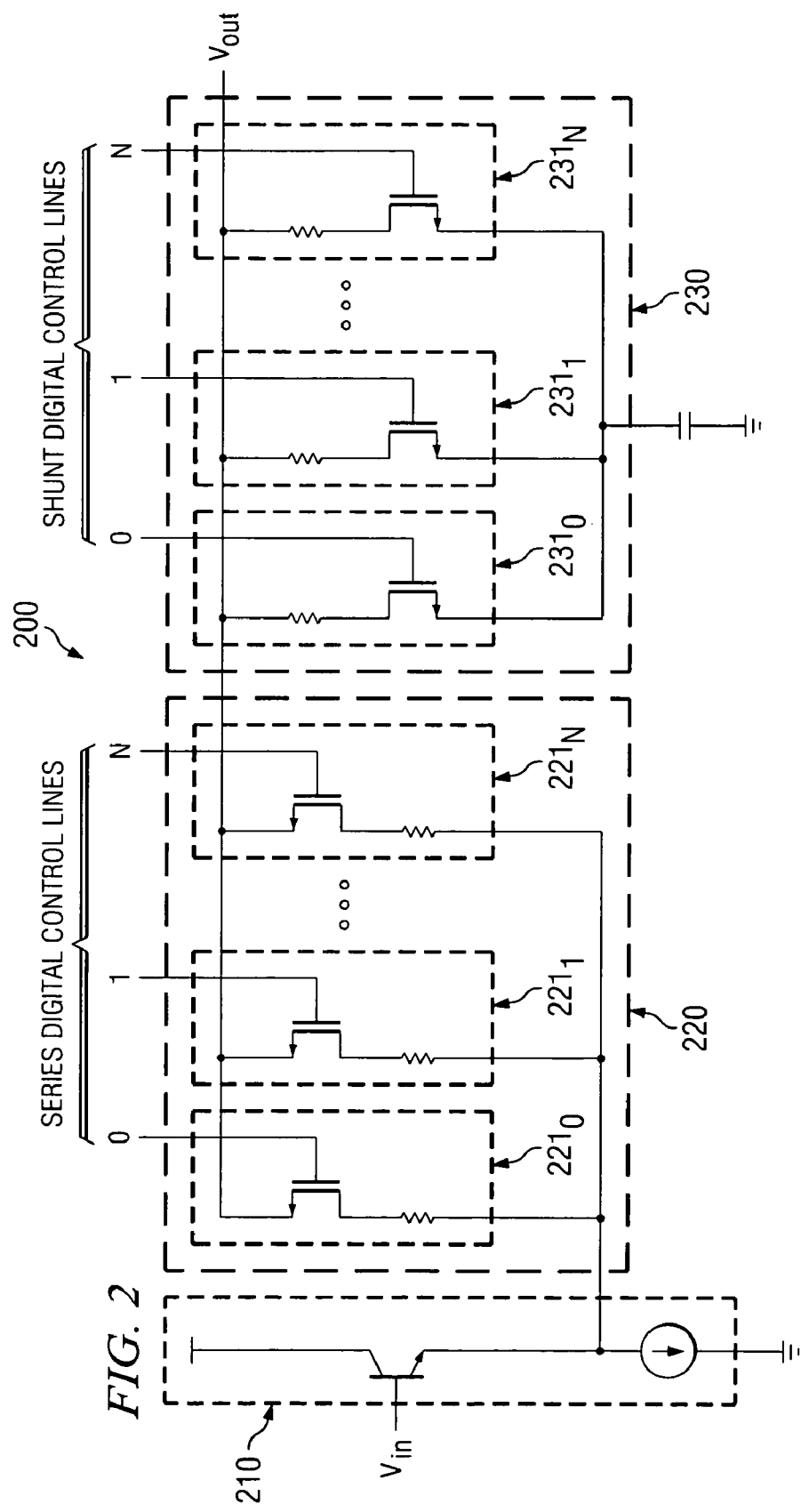
FIG. 2 is an illustration of an exemplary system adapted according to one embodiment of the invention.

FIG. 2 is an illustration of exemplary system 200 adapted according to one embodiment of the invention. In fact, system 200 conforms to the specifications of system 100 (FIG. 1) and may be used for AGC. System 200 includes input component 210, first adjustable impedance component 220, and second adjustable impedance component 230. Typically, many embodiments will use $V_{out}$ as an input to an amplifier (not shown) or other active circuit element.

Input component 210 in this example is an emitter follower, which is used to provide a buffer between the attenuator circuit (components 220 and 230) and circuitry on the other side of input component 210. Emitter followers, such as shown in system 200, may be adaptable to a number of embodiments because they generally cause minimal distortion, while providing separation between the source impedance and the input impedance of the attenuator circuit. Input component 210 is not limited to an emitter follower in various embodiments. For instance, input component 210 may simply be a wire contact receiving $V_{in}$ or may be a source-follower arrangement, or the like.

The attenuator circuit of the embodiment of FIG. 2 is a resistor divider including series component 220 and shunt component 230. Each adjustable impedance component 220 and 230 includes a plurality of legs (221 and 231, respectively) that conduct current when "turned on" by a switch, such as a Field Effect Transistor (FET), Bipolar Junction Transistor (BJT), or other type of switch. The number of "on" legs and their respective individual impedances determine the impedance of each component 220 and 230 at a given time. Thus, by selectively turning legs on or off through digital control lines, the impedances of the components, and, therefore, the attenuation of the circuit, can be controlled. The digital control lines may be connected in some embodiments to control logic, such as a feedback loop that measures signal level, distortion, and/or noise and adjusts the attenuation circuit accordingly. It should be noted, however, that in some embodiments not all legs are switchable. For example, each component 220 and 230 may include one leg 221, 231 that is not switchable so that the current paths are closed even when no legs are switched on, thereby providing maximum impedance and preventing an open circuit. For simplification, the impedance of component 220 is referred to as $Z_{ser}$, and the impedance of component 230 is referred to as $Z_{sh}$.

Typically, the impedance ($Z_{in}$) as seen by input component 210 is approximately equal to $Z_{sh}$ in parallel with the input impedance of the following stage ($Z_L$) plus $Z_{ser}$. The impedance ($Z_{out}$) seen by a component at $V_{out}$ is approximately equal to $Z_{sh}$ in parallel with the sum of $Z_{sh}$ and the output impedance of the previous stage ($Z_S$). Also, the attenuation is approximately equal to the sum of $Z_{sh}$ and $Z_{ser}$ divided by $Z_{sh}$. These relations are given in equations 1, 2, and 3, wherein "approximately" is plus or minus 20 percent:

$$Z_{in} \approx Z_{ser} + Z_{sh} // Z_L \qquad (1)$$

$$Z_{out} \approx Z_{sh} // (Z_{ser} + Z_s) \qquad (2)$$

$$\text{Attenuation} \approx \frac{Z_{sh} + Z_{ser}}{Z_{sh}} \qquad (3)$$

In some embodiments, it is advantageous to maintain a carrier-to-noise ratio at the output of an active element following a given attenuator approximately constant or increasing throughout the range of attenuation. The noise of interest including noise from components 220 and 230 and any active element at $V_{out}$ such as, for example, an amplifier (not shown). Additionally, in some embodiments it is desirable to maintain a carrier-to-distortion ratio at the output of an active element following a given attenuator approximately constant or increasing throughout the range of attenuation. The distortion of interest including distortion from components 220 and 230 and any active element at $V_{out}$ such as, for example, an amplifier (not shown).

In general, $Z_{in}$ is maintained relatively high in some embodiments in order to minimize distortion from the emitter follower in component 210. Also, many embodiments maintain $Z_{out}$ relatively low in order to keep noise from the amplifier at $V_{out}$ low. Maintaining the relationships of $Z_{in}$ and $Z_{out}$ may help to provide an attenuation circuit that performs similarly to the examples in FIGS. 3 and 4. The values of $Z_{in}$ and $Z_{out}$ may also be determined, at least in part, by impedance matching concerns with regard to adjacent circuit elements.

The high value for $Z_{in}$ and the low value for $Z_{out}$ depend on the specific application for which the attenuator is designed. For example, distortion caused by an emitter follower usually depends, at least in part, on the current therethrough and on the impedance immediately following it—in this case, $Z_{in}$. Also, an amplifier will usually experience better noise reduction if its source impedance seen by its input—in this case, the output impedance of the attenuator circuit, is lower than or equal to the optimal source impedance of the amplifier. Typically, an optimal source impedance of an amplifier is specific to each amplifier and represents the impedance wherein input referred voltage noise is equal to input referred current noise multiplied by source impedance. In one specific example, a system has an amplifier input at $V_{out}$, approximately 10 mA of current from the emitter follower of component 210, a floor value for $Z_{in}$ of 100 Ohms, and a ceiling value for $Z_{out}$ of 75 Ohms.

Any given attenuation level may be achieved by a multitude of ($Z_{ser}$, $Z_{sh}$) value pairs. Appropriate ($Z_{ser}$, $Z_{sh}$) value pairs may be determined using the constraints provided by a ceiling value for $Z_{out}$, a floor value for $Z_{in}$, equations 1, 2, and 3, and the carrier-to-noise and carrier-to-distortion relationships (described above) to advantageously provide attenuation in many applications. Specifically, in one example, a control system determines a desired attenuation level and adjusts the values of impedance components 220 and 230 to provide that attenuation level while staying within the constraints.

One advantage of some embodiments of the present invention is that the attenuator circuit can be disposed in a single semiconductor chip, thereby facilitating the production of larger single-chip or all-semiconductor systems. In fact, various embodiments may be included in chip-based RF tuners.

Returning to FIG. 2, in many embodiments, the switches in legs 221 and/or 231 of components 220 and 230 cause some amount of distortion. For example, when Metal Oxide Semiconductor (MOS) FETs are used as switches in legs 221 and/or 231, distortion caused thereby can often be a design or operation concern. This phenomenon is more likely when $Z_{ser}$ is high and the voltage drop is high across a particular switch in one or more legs 221. In system 200, each leg 221 and 231 includes a MOSFET switch and a resistor in series therewith. The ratio of resistance from the resistor and resistance from the MOSFET can be tailored for specific legs. Thus, when $Z_{ser}$ is high, the leg or legs 221 used in component 220 can have a resistance ratio of, e.g., 80% resistor and 20% MOSFET. As more legs 221 are switched on to lower the impedance of component 220, the resistance ratios of additional legs 221 may decrease to e.g., 50% resistor and 50% MOSFET, even as low as 100% MOSFET in a few legs 221. Such a design may help to reduce distortion, especially in component 220. Oftentimes, the voltage drop across component 230 will not have an appreciable affect on distortion, so resistance ratios of, e.g., 80% resistor and 20% MOSFET, can be appropriate for many, if not all, of legs 231.

The number of legs in a given embodiment can often determine the sizes of the incremental changes in attenuation that are available from the circuit. In one example, fourteen legs 221 in component 220 and eight legs 231 in component 230 are used to provide attenuation in 0.05 dB steps over a 36 dB range. In this example, legs 221 of component 220 provide coarse adjustments in the attenuation level, while legs 231 of component 230 provide fine tuning. At minimum attenuation ($Z_{ser}$ high, $Z_{sh}$ low), the first few legs 221 of component 220 switch out between 0.5 db and 1 dB attenuation increases, with legs 231 of component 230 providing fine tuning in a binary-coded manner. As attenuation increases, each leg 221 of component 220 represents a step of up to 3 dB, such that the frequency of switching in legs 221 of component 230 increases.

Figure 3:
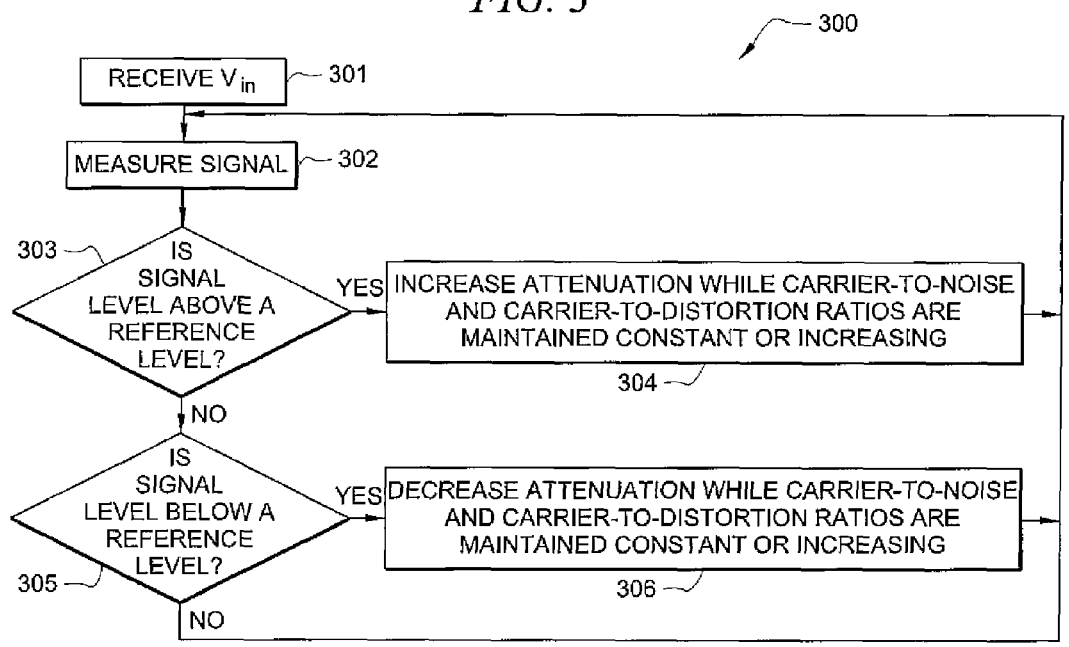
FIG. 3 is an illustration of an exemplary method adapted according to one embodiment for providing AGC in a circuit, such as the system of FIG. 1 or the system of FIG. 2.

FIG. 3 is an illustration of exemplary method 300 adapted according to one embodiment for providing AGC in a circuit, such as system 100 (FIG. 1) or system 200 (FIG. 2). Method 300 maybe performed, for example, by a control system implemented in hardware and/or software that keeps signal levels within an acceptable range in a circuit. In step 301, a voltage input signal is received. In step 302, the level (e.g., power value) of the signal is measured. In one example, the signal level may be measured at one or more places, including at $V_{out}$ or further downstream, such as at the output of an amplifier that uses $V_{out}$ for its input.

At step 303, it is determined from the measurement of step 302 if the signal level is above a desired level. If the signal level is above the desired level, then attenuation is increased in step 304 in order to keep the signal level close to the desired level, which in some embodiments means keeping the signal level approximately constant. Increasing the attenuation can be performed in one example by increasing $Z_{ser}$ of component 220 (FIG. 2) relative to $Z_{sh}$ of component 230. Further, the increase in attenuation in step 304 is performed so that a carrier-to-noise ratio at the output of an active element following a given attenuator is approximately constant or increasing throughout the range of attenuation. Additionally, a carrier-to-distortion ratio at the output of an active element following a given attenuator is kept approximately constant or increasing throughout the range of attenuation. Thus, distortion and noise levels are measured and accounted for when increasing attenuation.

In step 305, it is determined if the signal level is below a desired level. If the signal level is below the desired level, then the attenuation is decreased in step 306. Decreasing attenuation can be performed in one example, by decreasing $Z_{ser}$ of component 220 (FIG. 2) relative to $Z_{sh}$ of component 230. Further, the decrease in attenuation is performed such that a carrier-to-noise ratio at the output of an active element following a given attenuator is approximately constant or increasing throughout the range of attenuation. Additionally, a carrier-to-distortion ratio at the output of an active element following a given attenuator is kept approximately constant or increasing throughout the range of attenuation. Thus, similar to step 304, distortion and noise levels are measured and accounted for when decreasing attenuation.

In one or more embodiments, measuring, increasing, and/or decreasing are performed continuously or frequently to keep a signal level constant over a period of time or indefinitely. It should be noted that method 300 is for example only, and various embodiments are not limited to any one method of operation. For instance, although the method 300 is depicted as a series of sequential steps in FIG. 3, it is within the scope of embodiments to differ therefrom. Thus, step 301 may be performed continuously throughout method 300 rather than once, as shown, and, further, it may be performed simultaneously with other steps. Also, steps 303 and 305 may be performed as a single step that measures signal level or change in signal level and performs steps 304 and 306 accordingly.

Designers have been reluctant in prior art systems to create or use digital attenuators because the discrete steps may often cause a control system not to settle since there is usually some amount of error between the closest available step and the ideal value. Accordingly, a control system that performs method 300 may also include operations that allow it to settle at one or more discrete value as it operates continuously or frequently, such as, for example, by tolerating some amount of error.

Figure 4:
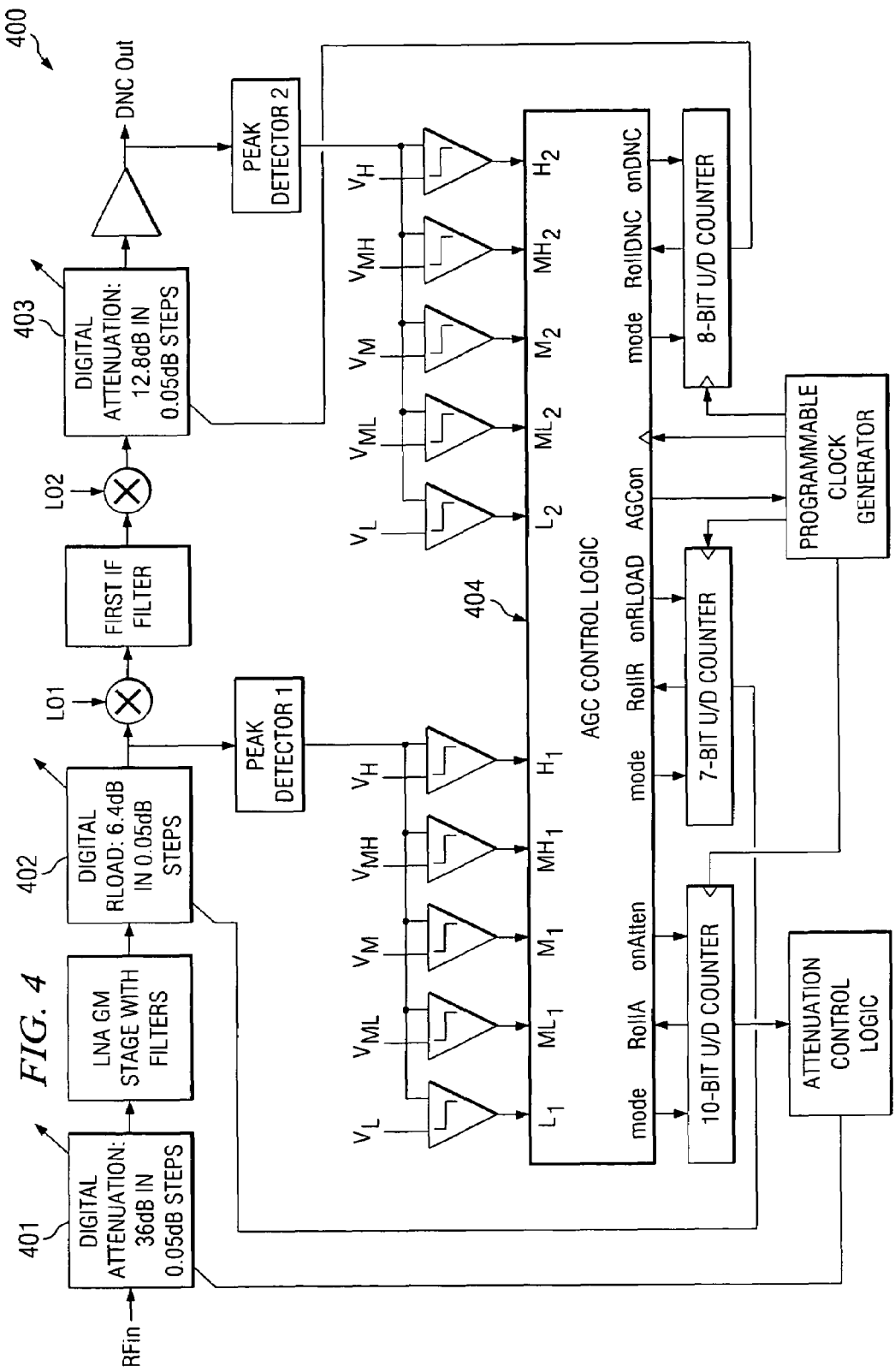
FIG. 4 is an illustration of an exemplary system adapted according to one embodiment of the invention.

FIG. 4 is an illustration of exemplary system 400 adapted according to one embodiment of the invention. System 400 is a gain control loop that includes three gain control blocks 401-403. Each gain control block 401-403 is an attenuator circuit as shown in FIG. 1. System 400 uses gains control blocks 401-403 for small gain steps throughout a RF receive signal path both to control an overall signal level in the RF signal path and to control signal levels at discrete points in the RF signal path.

System 400 uses AGC control logic 404 to measure signal levels and to control gain control blocks 401-403, as described in FIG. 3. An example operation of AGC control logic 404 is to determine an appropriate attenuation level of each one of gain control blocks 401-403. AGC control logic 404 adjusts the values of individual impedance elements in each one of gain control blocks 401-403 by selecting specific, discrete elements to achieve the desired attenuation level, each of the discrete elements having some amount of impedance. In this example, the values of the individual impedance elements in each one of gain control blocks 401-403 is determined, additionally, in view of constraints—a ceiling value for $Z_{out}$, a floor value for $Z_{in}$, equations 1, 2, and 3, and the carrier-to-noise and carrier-to-distortion relationships (described above). The values of the individual impedance elements may be determined by software or logic inside AGC control logic 404.

While the embodiments described above show two adjustable impedance components, various embodiments are not limited thereto. For instance, an example configuration includes one fixed impedance component and one adjustable impedance component. Another example embodiment includes three or more adjustable impedance components. In fact, arrangements with any number of adjustable impedance components are within the scope of the invention.

Further, there is no requirement that configurations must conform to the voltage-divider design of FIGS. 1 and 2. For instance, an R-2R ladder or other such arrangement may be used in some embodiments.

Also, while the examples in FIG. 2 shows the discrete legs as including resistors, various embodiments are not so limited. In addition to or alternatively to discrete, resistive elements, some embodiments may use reactive elements, such as capacitors and/or inductors to provide selectable impedance. In fact, reactive impedance from capacitors may be especially useful when attenuating lower frequency signals.

Various embodiments of the present invention may provide one or more advantages over prior art AGC systems. For example, some embodiments can be readily adapted for use in a semiconductor chip, thereby simplifying a tuner design and saving space compared to systems that use off-chip attenuators. Further, according to some embodiments, one or more attenuator circuits can be placed in an RF signal path, including immediately before the first amplifier in the signal path, thereby eliminating the need for AGC inside a distortion-causing amplifier. Still further, according to some embodiments, the number of selectable, discrete elements in a given adjustable impedance component is scalable and can provide nearly any desired step resolution for a given application.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An attenuator system comprising:
a first individually adjustable impedance component on a first current path between an input component and an output component, wherein said first adjustable impedance component includes a plurality of selectable, discrete legs, and wherein any combination of said legs of said first adjustable impedance component are selectable to create a first impedance value; and
a second individually adjustable impedance component between said first current path and ground, wherein said second adjustable impedance component includes a plurality of selectable, discrete legs.

2. The system of claim 1 wherein said output component is in communication with an active element selected from the list consisting of:
a low-noise amplifier;
a mixer;
a filter; and
a combination thereof.

3. The system of claim 1 wherein said first and second current paths are RF signal paths.

4. The system of claim 1 further comprising:
digital control logic operable to measure a signal power level and to provide said digital signals to said first and second adjustable impedance components to achieve an attenuation based at least in part on said measured signal power level.

5. The system of claim 1 wherein each of said selectable, discrete legs of said first adjustable impedance component includes a switch and is disposed such that each said leg conducts current on said first current path when its respective switch is closed.

6. The system of claim 5 wherein each of said selectable, discrete legs of said second adjustable impedance component includes a switch and is disposed such that each said leg conducts current on said second current path when its respective switch is closed.

7. The system of claim 6 wherein said legs of said first and second adjustable impedance components are in communication with one or more control circuits operable to switch said legs.

8. The system of claim 1 wherein said second adjustable impedance component is designed so that an impedance of said attenuator system as seen from the output component is less than or equal to a first set value.

9. The system of claim 1 wherein:
an impedance of said attenuator system as seen from said input component is approximately the parallel value of the impedances of said second adjustable impedance component and a stage following said second adjustable impedance component plus the impedance of said first adjustable impedance component;
an impedance of said attenuator system as seen from the output component is approximately the impedance of the second adjustable impedance component in parallel with the sum of said first adjustable impedance component and an impedance of a stage preceding said first adjustable impedance component; and
an attenuation provided by said attenuator system is approximately the sum of the impedances of said first and second adjustable impedance components divided by the impedance of said second adjustable impedance component.

10. The system of claim 1 wherein said input component is selected from the list consisting of:
an emitter follower; and
a source follower.

11. An attenuator system comprising:
an input component in communication with a first current path;
an output component on said first current path;
a first adjustable impedance component in series on said first current path between said input component and said output component, said first adjustable impedance component including a plurality of switchable impedances; wherein said plurality of switchable impedances are configured to allow two or more impedance switches to be activated simultaneously; and
a second adjustable impedance component in communication with said first current path, said second adjustable impedance component shunted, thereby creating a second current path, said second adjustable impedance component including another plurality of switchable impedances.

12. The system of claim 11 wherein said output component is in communication with an input of an active element.

13. The system of claim 11 wherein said second adjustable impedance component is shunted to a ground through a capacitor.

14. The system of claim 11 wherein said attenuator system is disposed with an RF tuner on a single semiconductor chip.

15. The system of claim 11 wherein said output component is a contact.

16. The system of claim 11 wherein said input component comprises one or more of:
   an emitter follower with a voltage input on a base thereof; and
   a source follower with a voltage input on a gate thereof.

17. The system of claim 11 wherein said plurality of switchable impedances of said first adjustable impedance component comprises:
   a plurality of parallel legs, each including a switch and disposed such that each said leg conducts current on said first current path when said switch is closed.

18. The system of claim 17 wherein said another plurality of switchable impedances of said second adjustable impedance component comprises:
   another plurality of parallel legs, each including a switch and disposed such that each said leg conducts current on said second current path when said switch is closed.

19. The system of claim 18 wherein said legs of said first and second adjustable impedance components are in communication with one or more control circuits operable to switch said legs.

20. The system of claim 11 wherein said second adjustable impedance component is designed so that an impedance of said attenuator system as seen from the output component is less than or equal to a first set value.

21. The system of claim 11 wherein:
   an attenuation provided by said attenuator system is approximately the sum of the impedances of said first and second adjustable impedance components divided by the impedance of said second adjustable impedance component.

22. A method for operating an attenuation circuit, wherein the attenuation circuit comprises an input component in communication with a first current path, an output component on said first current path, a first adjustable impedance component in series on said first current path between said input component and said output component, and a second adjustable impedance component, said second adjustable impedance component shunted from said first current path, thereby creating a second current path, said method comprising:
   receiving a signal at said input component; and
   based on a signal level of said signal, selectively switching one or more switchable, discrete impedances in each of said first and second adjustable impedance components, thereby adjusting impedances of said first and second adjustable impedance components to provide a desired signal level at a point in a signal path, wherein said selectively switching said one or more discrete impedances in said first adjustable impedance component provides coarse adjustments in the attenuation level, and selectively switching said one or more discrete impedances in said second adjustable impedance component provides fine adjustments in the attenuation level.

23. The method of claim 22 wherein said first current path is in communication with an input of an amplifier.

24. The method of claim 22 wherein said second adjustable impedance component is shunted to a ground through a capacitor.

25. The system of claim 22 wherein said desired signal level stays within a range of 3 dB.

26. The method of claim 22 wherein:
   each of said one or more switchable, discrete impedances of said first adjustable impedance component is one of a plurality of parallel legs, said legs each including a switch and disposed such that each leg conducts current on said first current path when its respective switch is closed; and
   each of said one or more switchable, discrete impedances of said first adjustable impedance component is one of another plurality of parallel legs, said legs each including a switch and such that each leg conducts current on said second current path when its respective switch is closed.

27. The method of claim 26 wherein said selectively switching comprises:
   switching one or more legs of each of said first and second adjustable impedance components to achieve a desired level of attenuation.

28. The method of claim 27 wherein an attenuation provided by said attenuation circuit is approximately the sum of the impedances of said first and second adjustable impedance components divided by the impedance of said second adjustable impedance component.

29. The method of claim 27 wherein said selectively switching comprises:
   switching said legs of said first adjustable impedance component to provide coarse adjustments to the attenuation level; and
   switching said legs of said second adjustable impedance component between said sequential switching in order to achieve attenuation in increments of 1.0 dB or smaller.

30. The method of claim 26 wherein one or more legs of said first adjustable impedance component are implemented using a resistive component and a transistor switch.

31. The method of claim 26 wherein one or more of said legs include transistors providing more than 50% of impedance for said one or more legs.

32. The method of claim 22 further comprising:
   measuring distortion at said input component; and
   adjusting said signal level so that a carrier-to-distortion ratio at the output component is constant or increasing.

33. The method of claim 22 further comprising:
   measuring a noise level for said output component and said amplifier; and
   adjusting said signal level so that a carrier-to-noise ratio at the output component is constant or increasing.

34. The method of claim 22 further comprising:
   maintaining an impedance seen by said input component to be above a first set value; and
   maintaining an impedance seen by said output component to be below a second set value.

* * * * *